(12) United States Patent
Borer et al.

(10) Patent No.: US 7,194,720 B1
(45) Date of Patent: Mar. 20, 2007

(54) METHOD AND APPARATUS FOR IMPLEMENTING SOFT CONSTRAINTS IN TOOLS USED FOR DESIGNING SYSTEMS ON PROGRAMMABLE LOGIC DEVICES

(75) Inventors: Terry P. Borer, Toronto (CA); Gabriel Quan, Toronto (CA); Stephen D. Brown, Toronto (CA); Deshanand P. Singh, Mississauga (CA); Chris Sanford, Toronto (CA); Vaughn Betz, Toronto (CA); Caroline Pantofaru, Toronto (CA); Jordan Swartz, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/618,416

(22) Filed: Jul. 11, 2003

(51) Int. Cl.
*G06F 17/50* (2006.01)

(52) U.S. Cl. .................. 716/16; 716/2; 716/8; 716/10

(58) Field of Classification Search ............. 716/2, 716/5–7, 8–17; 326/37–39, 41
See application file for complete search history.

(56) References Cited

U.S. PATENT DOCUMENTS

| | | | | |
|---|---|---|---|---|
| 5,197,016 A | * | 3/1993 | Sugimoto et al. | 716/8 |
| 6,311,316 B1 | * | 10/2001 | Huggins et al. | 716/12 |
| 6,643,833 B1 | * | 11/2003 | Nishioka et al. | 716/8 |
| 6,757,878 B2 | * | 6/2004 | Srinivasan et al. | 716/10 |
| 6,763,506 B1 | * | 7/2004 | Betz et al. | 716/6 |
| 6,779,169 B1 | * | 8/2004 | Singh et al. | 716/16 |
| 6,817,005 B2 | * | 11/2004 | Mason et al. | 716/16 |
| 6,871,328 B1 | * | 3/2005 | Fung et al. | 716/1 |
| 2002/0089348 A1 | * | 7/2002 | Langhammer | 326/38 |

* cited by examiner

*Primary Examiner*—Vuthe Siek
(74) *Attorney, Agent, or Firm*—L. Cho

(57) ABSTRACT

A method for designing a system on a target device utilizing programmable logic devices (PLDs) includes generating options for utilizing resources on the PLDs in response to user specified constraints. The options for utilizing the resources on the PLDs are refined independent of the user specified constraints.

26 Claims, 17 Drawing Sheets

```
<net name>
    <routing resource choice 1>  [||| <routing resource choice 2>  [....]]    (step 1)
    <routing resource choice 1>  [||| <routing resource choice 2>  [....]]    (step 2)
    <destination block name and input port>                    (end of connection 1)
    <routing resource choice 1>  [||| <routing resource choice 2>  [....]]    (step 3)
    <destination block name and input port>                    (end of connection 2)
```

FIG. 14

METHOD AND APPARATUS FOR IMPLEMENTING SOFT CONSTRAINTS IN TOOLS USED FOR DESIGNING SYSTEMS ON PROGRAMMABLE LOGIC DEVICES

FIELD OF THE INVENTION

The present invention relates to the field of programmable logic devices (PLDs). More specifically, the present invention relates to a method and apparatus for implementing soft constraints in tools used for designing systems on PLDs such as electronic design automation (EDA) tools.

BACKGROUND

PLDs may be used to implement large systems that include millions of gates and megabits of embedded memory. Of the tasks required in managing and optimizing design, placement of logical components on the PLDs and routing connections between logical components on the PLD utilizing available resources can be the most challenging and time consuming. In order to satisfy timing and placement specifications, several iterations are often required to determine how logical components are to be placed on the target device and which routing resources to allocate to the logical components.

The complexity of large systems often requires the use of EDA tools to manage and optimize their design onto physical target devices. Automated placement and routing algorithms in EDA tools perform the time consuming task of placement and routing of logical components onto physical devices. However, even state of the art automated placement and routing algorithms are sometimes incapable of producing solutions that are comparable to user defined manual placement. User defined manual placement techniques may be able to identify critical sections of logic that should be grouped together in order to satisfy timing constraints that automated placement algorithms are slow to or even unable to identify. Similarly, user defined manual routing techniques may be able to identify efficient routing strategies that automated routing algorithms may have difficulties recognizing.

In order to leverage user-knowledge into the automated placement and routing process, some EDA tools allow users to provide input such as user-specified constraints into its automated placement and routing algorithms. The drawbacks of these functions are that these EDA tools invite users to over-constrain which makes the placement and routing procedure less efficient. In the worse cases, over-constraining may result in placement and routing failures or poor performance of systems.

Thus, what is needed is a method and apparatus for leveraging user specified constraints in the design process only when those constraints are helpful in the placement and routing of logical components.

SUMMARY

According to an embodiment of the present invention, tools used for designing PLDs support soft constraints that are specified by users. Soft constraints are constraints that may be specified for the placement of a component onto a target device or the routing of signals on the target device. The soft constraints operate to assist the tools used for designing PLDs. According to an embodiment of the present invention, the tools may disregard the soft constraints while performing placement and routing if the soft constraints prevent logical components from being placed or routed properly or efficiently on the system. Alternatively, the tools may disregard the soft constraints during the course of placement and routing and allow the automated placement and routing algorithms to operate unconstrained after a predetermined event.

BRIEF DESCRIPTION OF THE DRAWINGS

The features and advantages of the present invention are illustrated by way of example and are by no means intended to limit the scope of the present invention to the particular embodiments shown, and in which:

FIG. 14 illustrates an exemplary portion of a routing constraint file according to an embodiment of the present invention;

DETAILED DESCRIPTION

Figure 1:
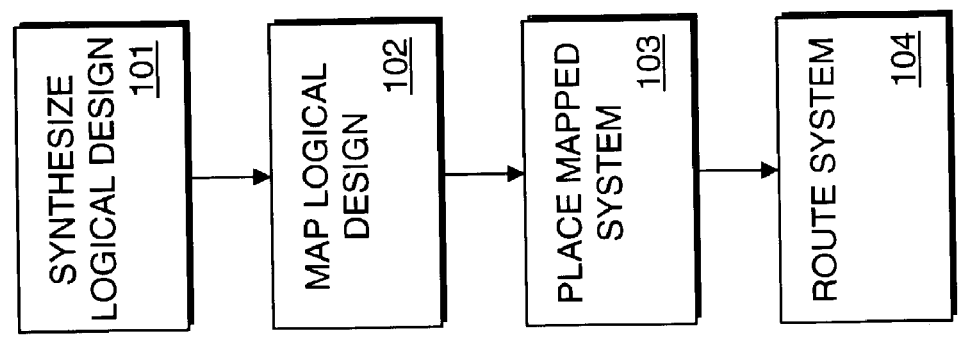
FIG. 1 is a flow chart illustrating a method for designing a system according to an embodiment of the present invention.

FIG. 1 is a flow chart that illustrates a method for designing a system according to an embodiment of the present invention. The method may be performed with the assistance of an EDA tool, for example. At 101, synthesis is performed. Synthesis includes generating a logic design of the system to be implemented by a target device. According to an embodiment of the present invention, synthesis generates an optimized logical representation of the system from a Hardware Description Language (HDL) design definition. The optimized logical representation of the system may include a representation that includes a minimized number of logic gates and logic elements required for the system. Alternatively, the optimized logical representation of the system may include a representation that has a reduced depth of logic and that generates a lower signal propagation delay.

Figure 2:
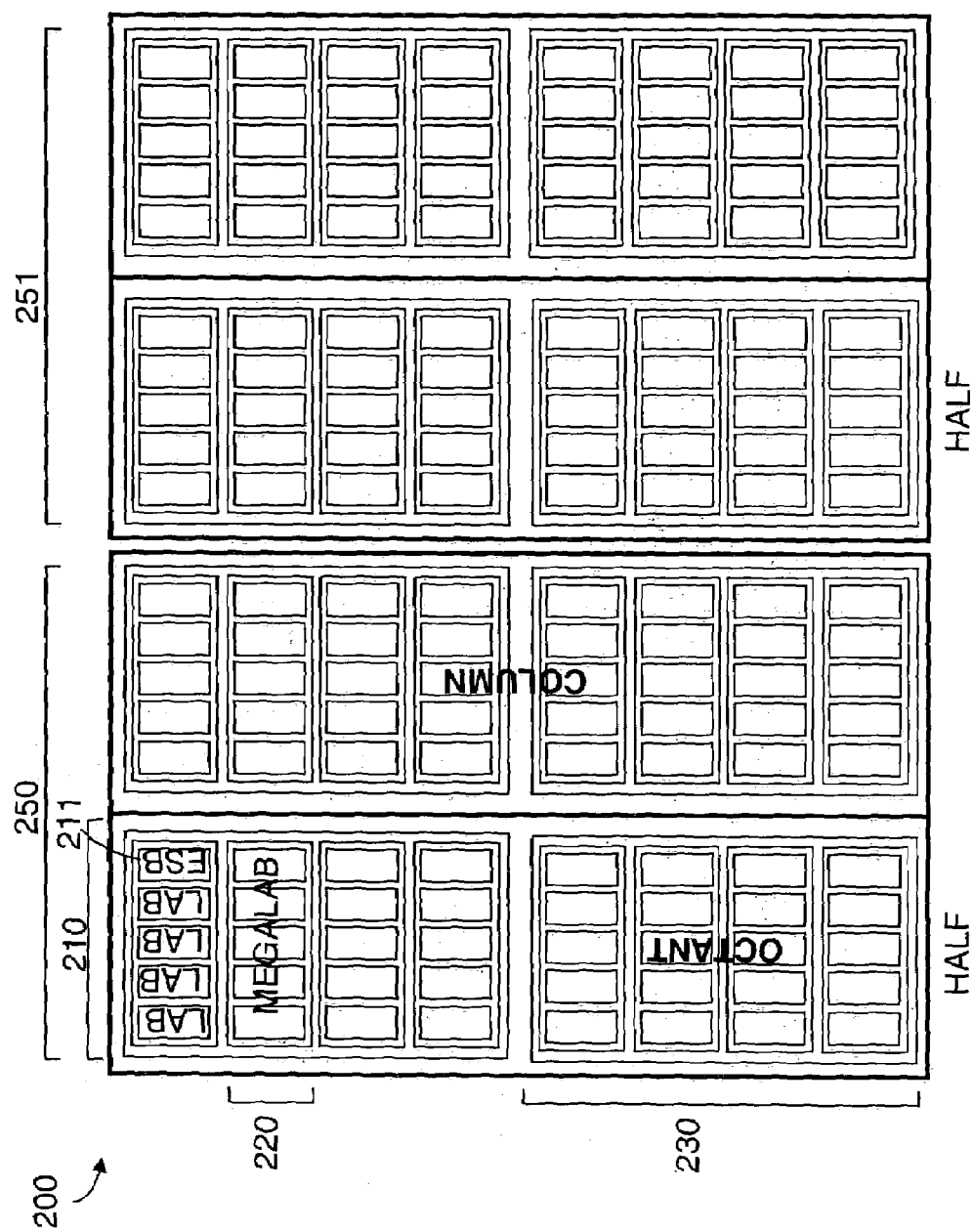
FIG. 2 illustrates a target device utilizing PLDs according to an embodiment of the present invention.

FIG. 2 illustrates an exemplary target device 200 utilizing programmable logic devices (PLDs) according to an embodiment of the present invention. In one embodiment, the target device 200 is a chip having a hierarchical structure that may take advantage of wiring locality properties of circuits formed therein. The lowest level of the hierarchy is a logic element (LE) (not shown). According to one embodiment of the target device 200, the LE may include a 4-input lookup table with a configurable flip-flop. Groups of 10 LEs form a logic-array block (LAB). A first group of LABs is shown as 210. LEs in a LAB are able to communicate with other LEs via LAB local interconnect lines (not shown).

Groups of 16 LABs and 1 embedded system block (ESB) 211 form a MegaLab. A first MegaLab is shown as 220. ESBs may be used to implement memory circuitry such as random access memories (RAMs), read only memories (ROMs), content addressable memories (CAMs), and other types of memory circuitry. Each LAB in a MegaLab is able to communicate with its adjacent neighboring LABs via the LAB local interconnect lines. Alternatively, communication may be sent via a MegaLab interconnect (not shown), which includes a set of continuous metal lines that span the width of the MegaLab. LEs within any LAB can directly drive the MegaLab interconnect. The signal then traverses the metal line to a local input line associated with the destination LAB, and then to any dependent LE.

Groups of 13 MegaLabs form an Octant. A first Octant is shown as 230. Each MegaLab in an Octant is able to communicate with other MegaLabs via a series of continuous vertical interconnect lines (V-lines) (not shown). Signals communicating across an Octant start from a source LE that directly drives a V-line. The signals traverse to the target MegaLab, switch onto the MegaLab interconnect, and make their way to the destination LE.

Two Octants are stacked vertically to form a Column. A first Column is shown as 240. Communication between Octants is made possible by a buffered switch (not shown) that connects the V-lines between two Octants together.

Groups of two Columns form a Half. A first Half is shown as 250 and a second Half is shown as 251. Continuous horizontal interconnect lines (H-lines) run across the width of the two Columns. Signals that traverse across the Half start at the source LE which can directly drive the H-line. From the H-line, the signal can drive an appropriate V-line in the target Octant and traverse its way to the destination LEs using the intra-Octant communication scheme. Two Halves are grouped side by side to form a Chip. The two Halves are connected to the buffered switch which may be used for communication between Halves. According to an embodiment of the present invention, each level of the hierarchy described has delay characteristics. As communication is transmitted out of each level of hierarchy, a delay may be incurred and as communication is transmitted to a next higher level of hierarchy, a larger delay may be incurred.

FIG. 2 illustrates an exemplary embodiment of a target device. It should be appreciated that a target device may include a plurality of Chips, such as target device 200 cascaded together. A target device may include programmable logic devices arranged in a manner different than that on the target device 200. Furthermore, a target device may include components other than those described in reference to the target device 200. Thus, while the invention described herein may be utilized on the architecture described in FIG. 2, it should be appreciated that it may also be utilized on different architectures, such as those employed by Altera® Corporation in its STRATIX™, and Mercury™ family of chips and those employed by Xilinx®, Inc. in its Virtex™ and Virtex™ II line of chips.

Referring back to FIG. 1, at 102, the optimized logical design of the signal is mapped. Mapping includes determining how to implement logic gates and logic elements in the optimized logic representation with specific resources on a target device. According to an embodiment of the present invention, a netlist is generated from mapping. The netlist illustrates how the resources of the target device are utilized to implement the system. The net list may, for example, include a representation of the components on the target device and how the components are connected.

At 103, the mapped logical system design is placed. Placement includes fitting the system on the target device by determining which resources on the target device is to be used for specific logic gates, logic elements, and connections between components. The placement procedure may be performed by a placer in an EDA tool (not shown) that utilizes placement algorithms. According to an embodiment of the present invention, a user (designer) may provide input to the placer by specifying placement constraints. The constraints may include defining logic regions that group certain components of a system together. The components may be for example, digital logic, memory devices, or other components. The size of the logic regions may be determined by the user or by a sizing method. The placement of the logic regions may be determined by the user or by a placement method.

According to an embodiment of the present invention, the user may assign a size to each logic region defined. Alternatively, the user may designate a logic region to be automatically sized. When a logic region is automatically sized, the size and shape of the logic region are determined by a sizing method. The method assumes that the logic region is to be sized such that it runs as efficiently as possible. According to an embodiment of the sizing method, a shape is found that will fit the components assigned to the logic region.

According to an embodiment of the sizing method where sizing is performed on a logic region with predominantly logic circuits, the following technique may be used. The term $n_{LE}$ represents a number of LEs assigned to a logic region to be automatically sized.

Let $A_{LAB}$ represent the number of LEs in a LAB. According to the embodiment of the target device shown in FIG. 1, $A_{LAB}$ equals 10.

Let $A_{MLAB}$ represent the number of LEs in a MegaLab. According to the embodiment of the target device shown in FIG. 1, $A_{MLAB}$ equals 160.

Let $A_{OCT}$ represent the number of LEs in an Octant. According to the embodiment of the target device shown in FIG. 1, $A_{OCT}$ equals 2,080.

Let $A_{COL}$ represent the number of LEs in a Column. According to the embodiment of the target device shown in FIG. 1, $A_{COL}$ equals 4,160.

Let $A_{HALF}$ represent the number of LEs in a Half. According to the embodiment of the target device shown in FIG. 1, $A_{HALF}$ equals 8,320.

Let $A_{CHIP}$ represent the number of LEs in a Chip. According to the embodiment of the target device shown in FIG. 1, $A_{CHIP}$ equals 16,640.

Figure 3:
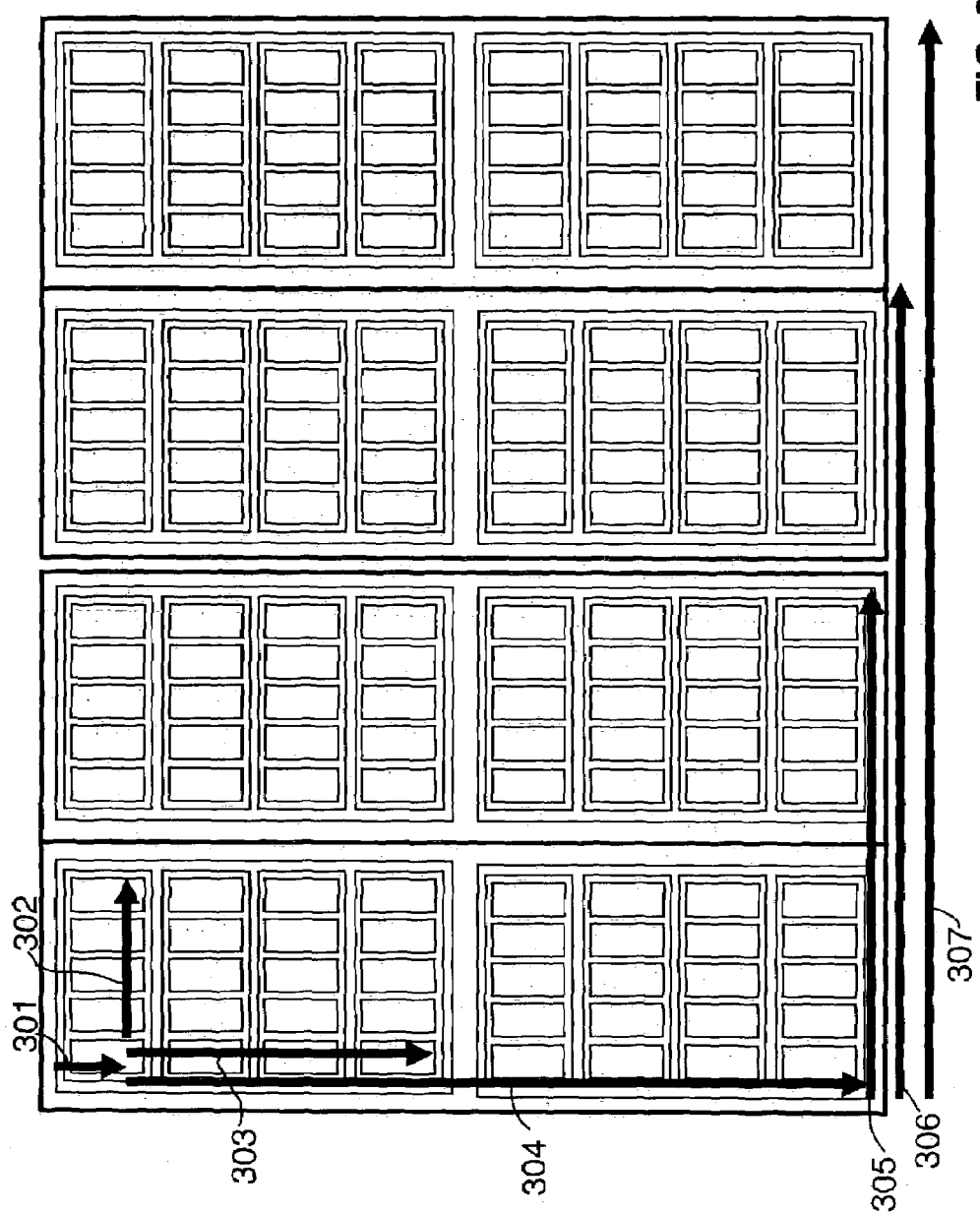
FIG. 3 illustrates the sizing of a logic region that includes predominantly logic circuits according to an embodiment of the present invention.

With reference to FIG. 3, the following process may be taken to determine a size and shape of a logic region. If $n_{LE} \leq A_{LAB}$, then the size of the logic region equals 1 LAB. The arrow corresponding to reference number 301 illustrates the direction the logic region would extend to if the preceding condition were true.

If $n_{LE} \leq A_{MLAB}$, then the size of the logic region equals $[n_{LE}/A_{LAB}]$ horizontal LABs. The arrow corresponding to reference number 302 illustrates the direction the logic region would extend to if the preceding condition were true. According to an embodiment of the present invention, the size calculation is rounded up to a whole number.

If $n_{LE} \leq A_{COT}$, then the size of the logic region equals $[n_{LE}/A_{MLAB}]$ vertical MegaLabs. The arrow corresponding to reference number 303 illustrates the direction the logic region would extend to if the preceding condition were true.

If $n_{LE} \leq A_{COL}$, then the size of the logic region equals $[n_{LE}/A_{MLAB}]$ vertical MegaLabs. The arrow corresponding to the reference number 304 illustrates the direction the logic region would extend to if the preceding condition were true.

If $n_{LE} \leq A_{HALF}$, then the size of the logic region equals 2 horizontal MegaLabs by $[n_{LE}/(2*A_{MLAB})]$ vertical MegaLabs. The arrow corresponding to the reference number 305 illustrates the direction the logic region would extend to if the preceding condition were true.

If $n_{LE} \leq A_{HALF}+A_{COL}$, then the size of the logic region equals 3 horizontal MegaLabs by $[n_{LE}/(3*A_{MLAB})]$ vertical MegaLabs. The arrow corresponding to reference number 306 illustrates the direction the logic region would extend to if the preceding condition were true.

If $n_{LE} \leq A_{CHIP}$, then the size of the logic region equals 4 horizontal MegaLabs by $[n_{LE}/(4*A_{MLAB})]$ vertical MegaLabs. The arrow corresponding to reference number 307 illustrates the direction the logic region would extend to if the preceding condition were true.

Figure 4:
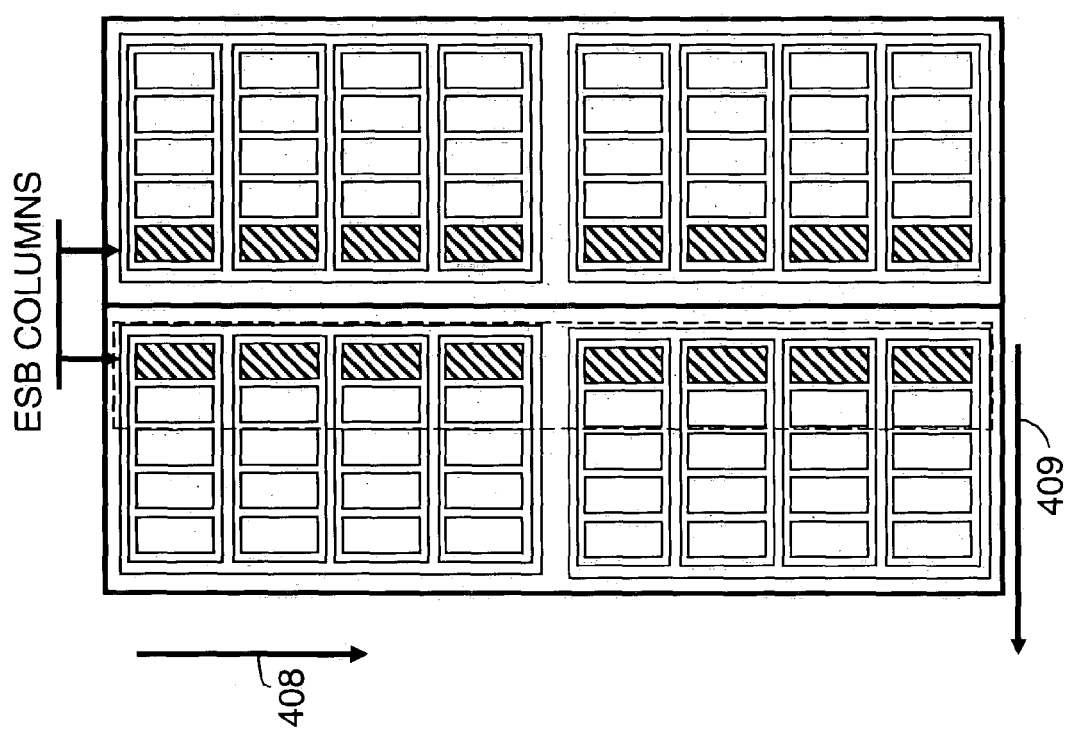
FIG. 4 illustrates the sizing of a logic region that includes predominantly memory circuitry according to an embodiment of the present invention.

According to an embodiment of the sizing method where sizing is performed on a logic region with primarily memory components, the following technique may be used. This is illustrated with reference to FIG. 4. As shown, the ESBs typically reside in a column. A size and shape of a logic region is created such that it includes a sufficient number of ESBs required for implementing the memory components. The arrow corresponding to reference number 408 illustrates the direction the logic region would extend to as more ESBs were required. The region is then extended to include just enough LAB columns to satisfy the requirement of the memory components. The arrow corresponding to reference number 409 illustrates the direction the logic region would extend to as more LEs were required.

Figure 5:
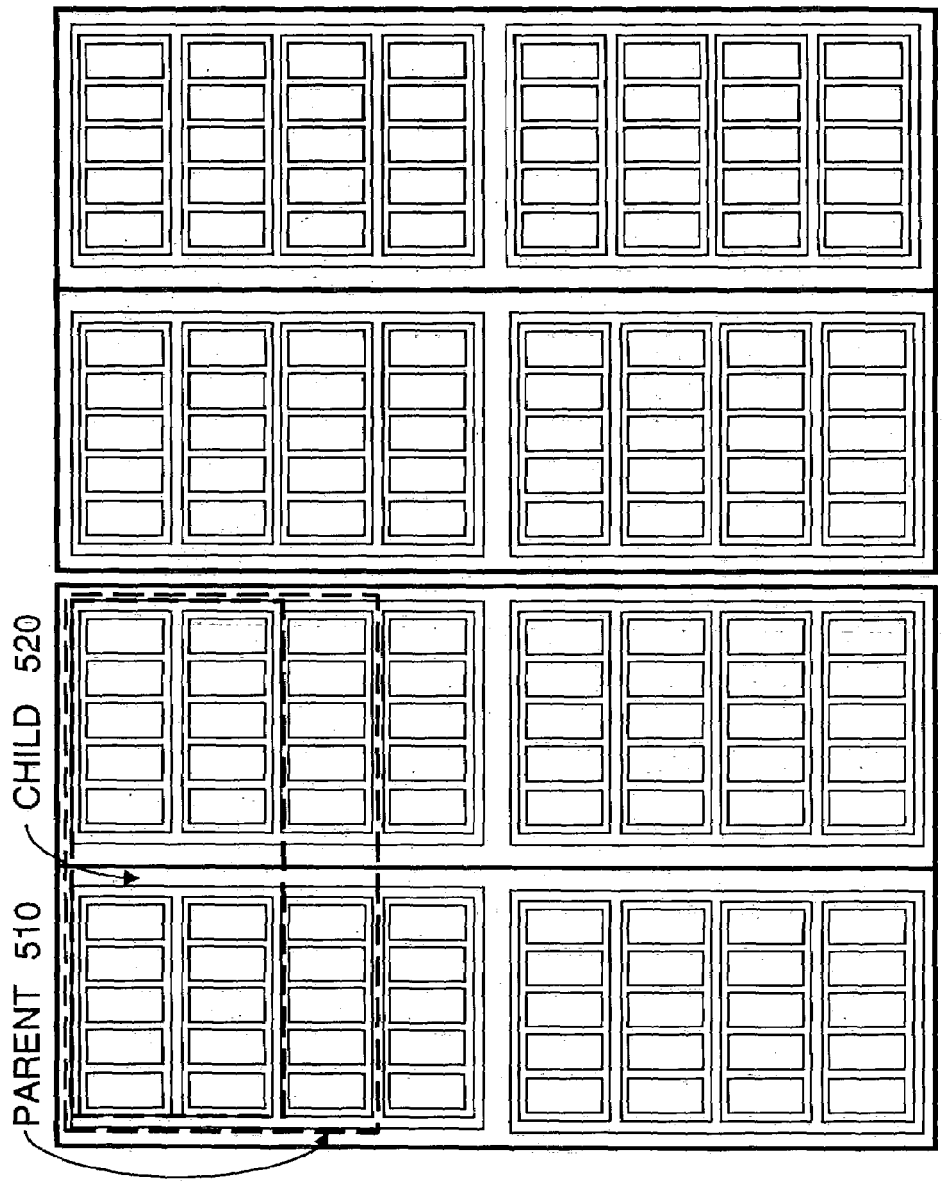
FIG. 5 illustrates an example of a fixed parent logic region constraining the sizing of a child logic region according to an embodiment of the present invention.

In the event that a user has created hierarchies that include combinations of fixed-sized and automatically sized region, the sizing method of the present invention would take into account these new constraints. FIG. 5 illustrates an example of a parent logic region 510 that constrains the size of a child logic region. The parent logic region 510 has a fixed size determined by the user. The child logic region is to be automatically sized. If the child logic region includes primarily logic circuits, it would typically be sized to occupy a single Octant. However, an Octant sized child logic region would fall outside the parent logic region 510. Thus, the preferred dimension of the child logic region is reshaped such that it fits within its parent and is shown as 520.

Figure 6:
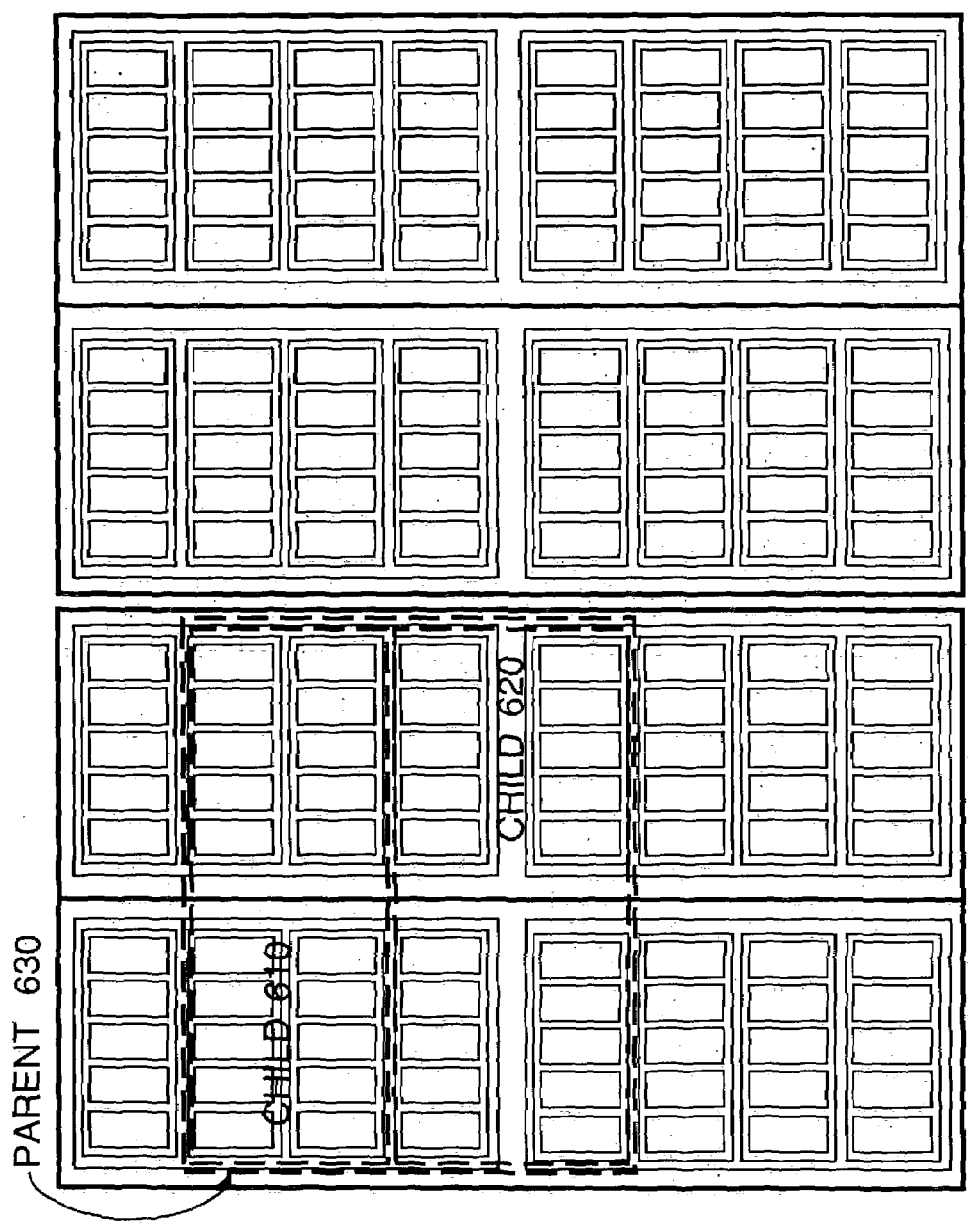
FIG. 6 illustrates an example of a fixed child logic region constraining the sizing of a parent logic region according to an embodiment of the present invention.

Similarly, FIG. 6 illustrates an example of child logic regions 610 and 620 that constrain the size of a parent logic region. The child logic regions 610 and 620 have fixed sizes determined by the user. The parent logic region is to be automatically sized. If the parent logic region includes primarily logic circuits, it would typically be sized to occupy a subset of a Column. However, the sizing constraints for the child logic regions 610 and 620 would make this assignment illegal. The preferred dimension of the parent logic region is reshaped to comply with the fixed dimensions of the child logic regions 610 and 620 and is shown as 630.

According to an embodiment of the present invention, the user may also assign a size to a defined logic region and mark the region as a "soft region". By marking the logic region as a soft region, a preference will be given to having the logic region confined within the assigned size. However, if after determining the placement of other logic regions in the system it is discovered that the logic region marked as a soft region cannot be confined within the assigned size or that by confining the logic region to the assigned size other requirements in the system cannot be met, components assigned to the logic region are permitted to be positioned outside the boundaries of the logic region. According to one embodiment, the sizing may be achieved by using the sizing method described.

Figure 7:
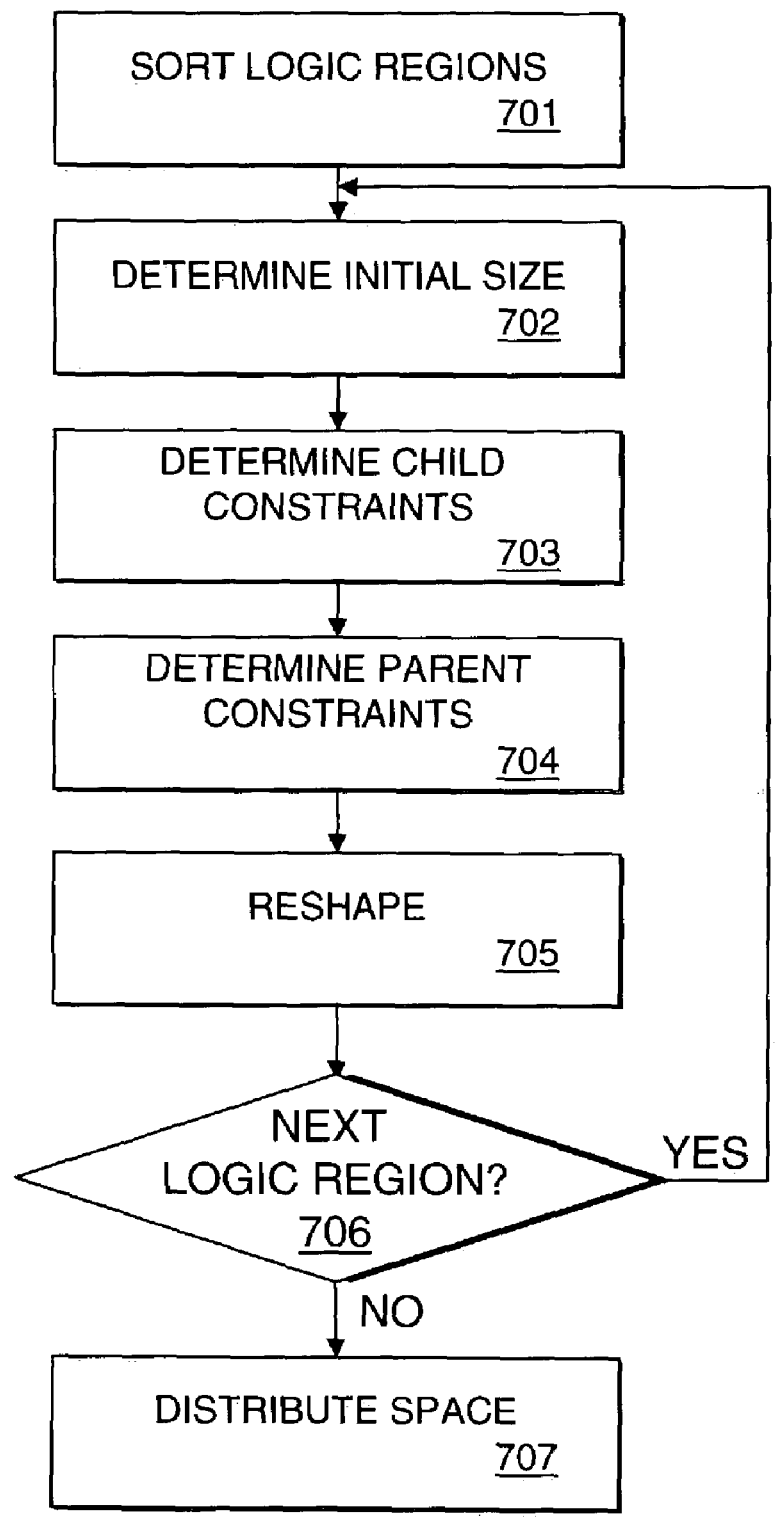
FIG. 7 is a flow chart that illustrates a method for sizing logic regions according to an embodiment of the present invention.

FIG. 7 illustrates a method for sizing logic regions according to an embodiment of the present invention. At 701, the logic regions are sorted in reverse topological order such that child regions are ordered before the parent logic regions.

At 702, an initial size is determined for the logic region based on the LE and ESB required for components on the logic region.

At 703, constraints of any child logic region of the logic region are determined.

At 704, constraints of any parent logic region of the logic region are determined.

At 705, the initial size of the logic region may be reshaped in response to the constraints of any child and/or parent logic region of the logic region. It should be appreciated that reshaping may not be required if no constraints exist or if the constraints do not affect the initial size of the logic region.

At 706, it is determined whether a next logic region is to be evaluated. If a next logic region is to be evaluated, control proceeds to 702. If a next logic region is not to be evaluated, control proceeds to 707.

At 707, extra spaces on the target device are distributed to the logic regions evaluated.

According to an embodiment of the present invention, the user may assign a location on the target device to each logic region defined. Alternatively, the user may designate a logic region to "float" or be automatically placed. For a logic region that is to be automatically placed, the location of placement of the logic region is determined by a placement method according to an embodiment of the present invention. The method finds initial feasible locations for the logic regions that serve as a starting solution that will be iteratively optimized. In an unconstrained design flow, the initial placement may simply scatter the logic regions across the target device. According to an embodiment of the placement method, the initial placement is feasible with respect to any constraints imposed by the architecture. For example, in the target device 200 shown in FIG. 2, the placement of ESBs are only legal in certain columns of the target device 200. It should be appreciated that the initial placement of the logic regions may be determined using other methods or techniques.

After the initial placement, the logic regions are moved to different locations on the target device. The placement method operates in accordance with a plurality of guidelines. A first guideline, according to an embodiment of the placement method, is that logic regions may not overlap each other. The constrained motion imposed by the first guideline prevents the undesirable consequence of having logic regions share LEs. Although steps may be taken to perturb logic regions to ensure an overlap free solution at the end of the placement process, such moves at the end of the placement process could have an undesirable effect on inter and intra logic region timing constraints. According to an embodiment of the present invention, floating regions may overlap under certain conditions.

According to an embodiment of the present invention, a region on the target device may be marked as "reserved". The reserved region may be used, for example, for the placement of a designated component. According to an embodiment of the placement method, the first guideline not only prohibits the overlapping of logic regions, but also prohibits the placement of a logic region or any component not assigned a logic region onto a reserved region on the target device. It should be appreciated that a logic region itself may be marked as reserved in order to prevent components other than those assigned to the logic region to be placed in the logic region.

Figure 8:
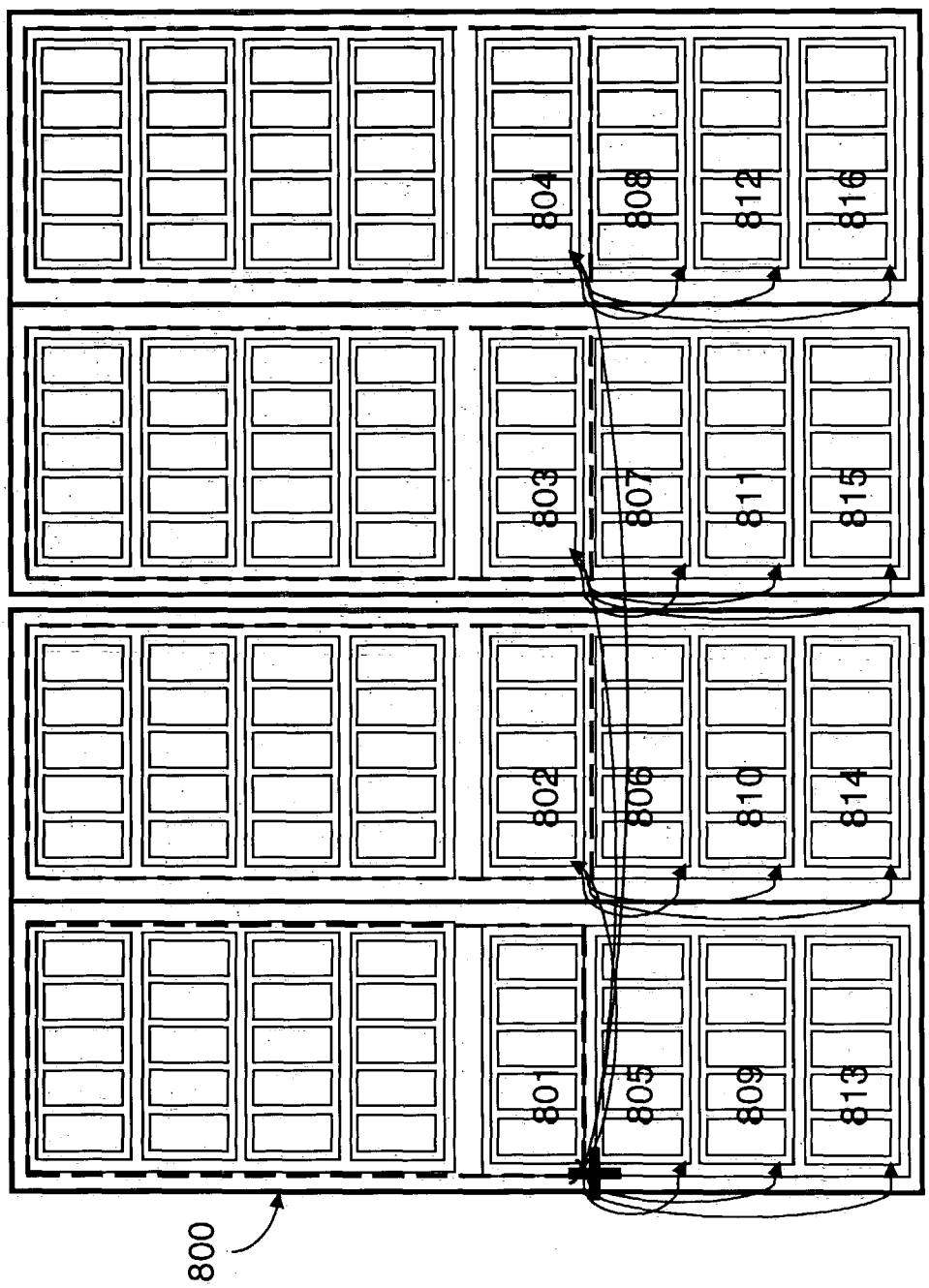
FIG. 8 illustrates a graphical depiction of the restrictions on logic region mobility according to an embodiment of the present invention.

A second guideline, according to an embodiment of the placement method, is that if a region is created within a physical Column of the target device, the logic region will not be moved to span outside a single Column of the target device. FIG. 8 illustrates the possible locations that a logic region 800 may be moved to. The origin of the logic region 800, defined by its lower left corner, may be moved from a first position denoted by 801 to a plurality of positions denoted by 802–816. The constrained motion imposed by the second guideline provides the system with better predictability that the timing requirements within a logic region will be satisfied.

Figure 9:
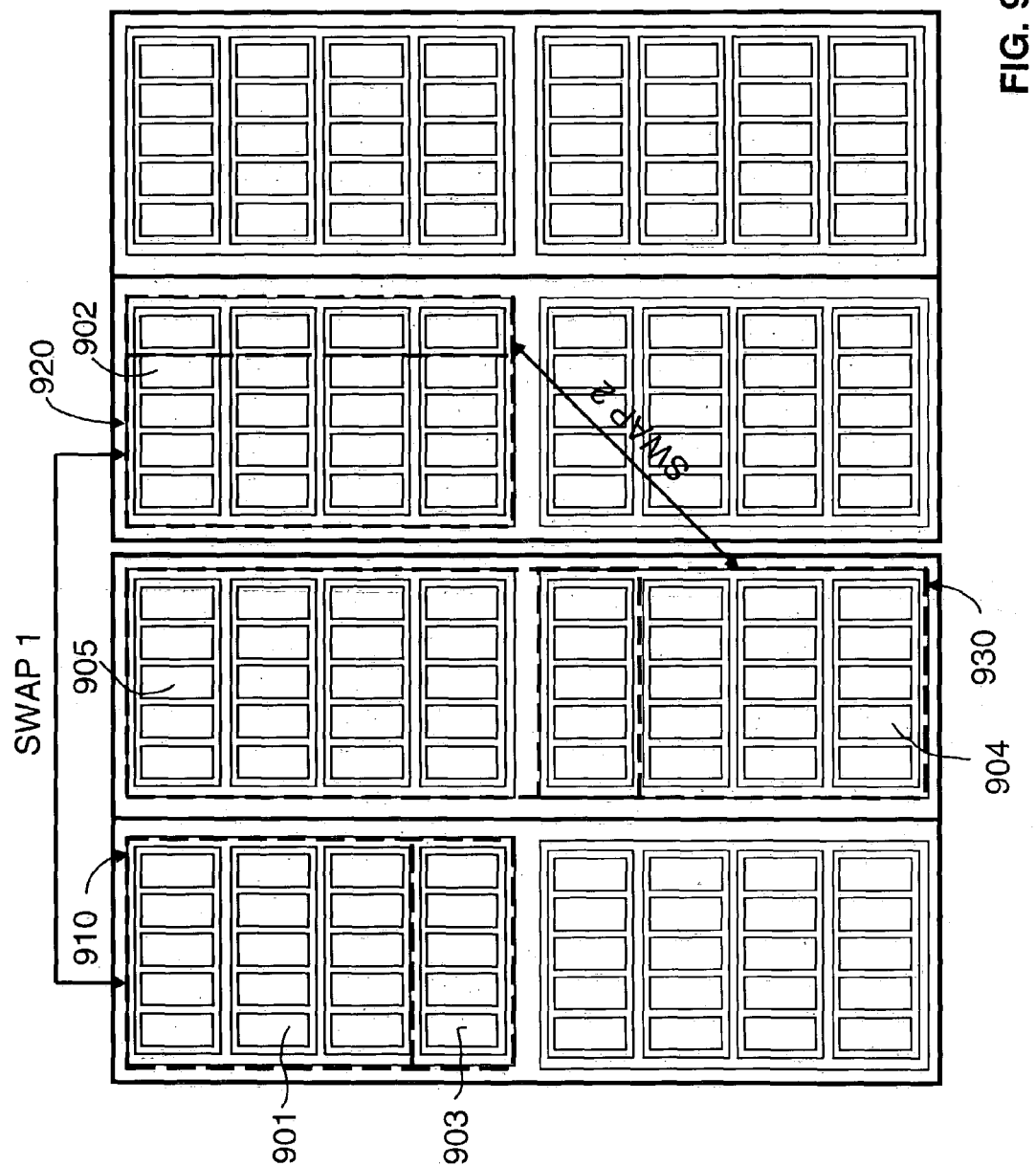
FIG. 9 illustrates graphical depictions of logic region extensions according to an embodiment of the present invention.

A third guideline, according to an embodiment of the placement method, is that a location of an extended region of a first logic region may be interchanged with a location of a second logic region given that both encapsulate all logic regions that they touch. Furthermore, both locations must be within the parent logic region of the first logic region. FIG. 9 illustrates the applicability of the third guideline. The move denoted by Swap 1 attempts to move the logic region 901 to a location occupied by 902. Notice that the locations of logic regions 901 and 902 cannot be swapped because they have different sizes. To make this move, the location of logic region 901 is extended outwards until it is the same size of logic region 902 as shown by dotted region 910. This extension also encapsulates the logic region 902 as shown by dotted region 920. The location of the extended region of the logic region 901, which also includes logic region 903, may now be swapped with the location of the logic region 902. The extension procedure of the third guideline is not always possible, however, as shown by the move denoted Swap 2. This swap attempts to move logic region 904 to the location occupied by 902. If the location of logic region 904 was extended to the size of 902 as shown by dotted region 930, it would intersect only a portion of the logic region 905.

Figure 10:
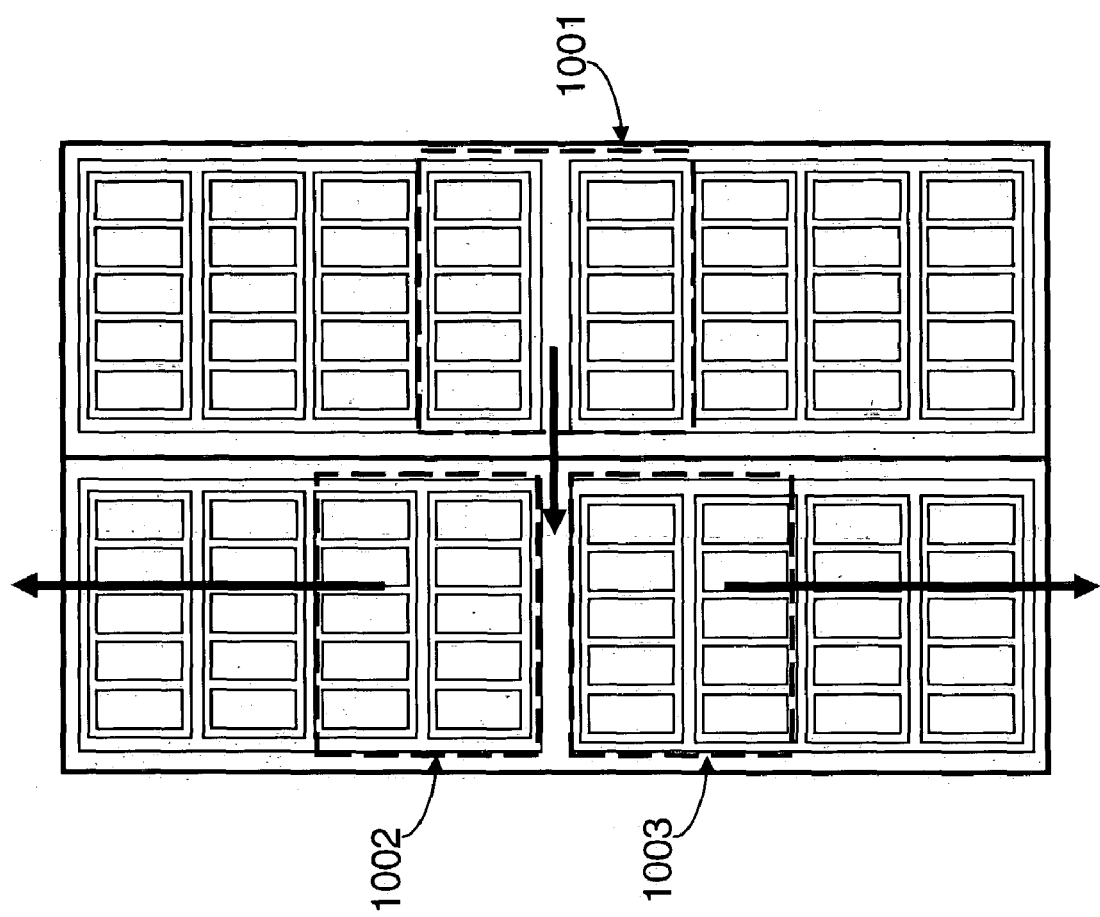
FIG. 10 illustrates a graphical depiction of bumping logic regions according to an embodiment of the present invention.

A fourth guideline, according to an embodiment of the placement method, is that a plurality of logic regions may be moved or "bumped" in order for another logic region to be moved onto their location. FIG. 10 illustrates the applicability of the fourth guideline according to an embodiment of the present invention. The logic region 1001 attempts to move to the location shared by logic regions 1002 and 1003. The fact that logic regions 1002 and 1003 block a potential move is "remembered" by the placement method. A next time a move for logic regions 1002 and 1003 is selected, the logic regions 1002 and 1003 would be biased outwards to allow the move of 1001.

Figure 11:
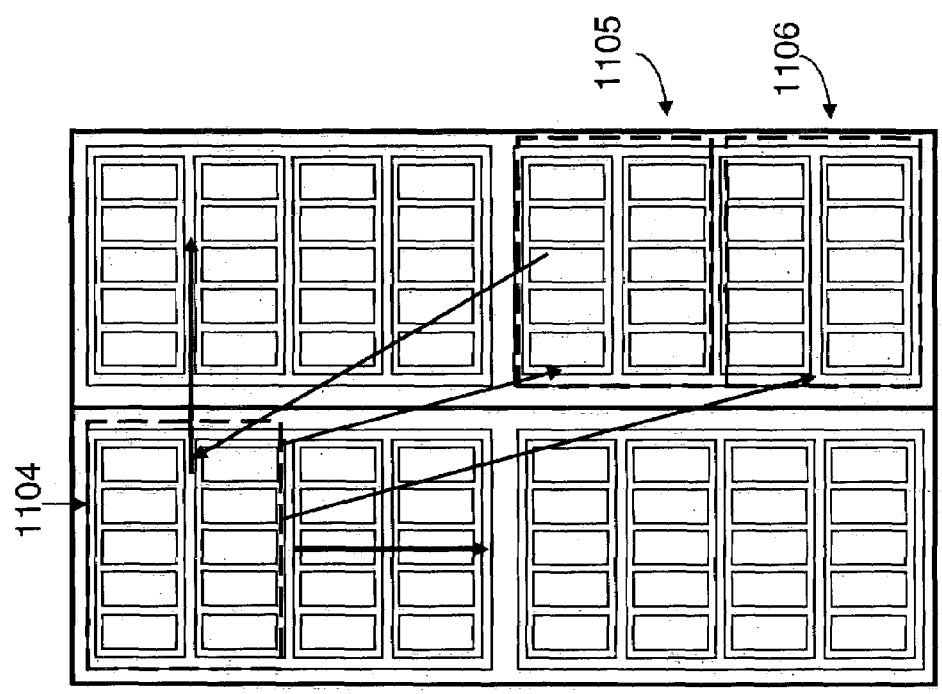
FIG. 11 illustrates a graphical depiction of a critical vector move according to an embodiment of the present invention.

A fifth guideline, according to an embodiment of the placement method, is that a logic region is moved in the direction of the sum of all incoming and outgoing critical connections to other logic regions. FIG. 11 illustrates the applicability of the fifth guideline according to an embodiment of the present invention. Logic region 1104 has a plurality of critical connections to the logic regions 1105 and 1106. A vector is computed in the direction of the sum of all incoming and outgoing critical connections from the logic region 1104. All moves of the logic region 1104 are biased in the direction of the critical vector.

After logic regions are moved to a new location, a cost function associated with the move is evaluated. According to an embodiment of the placement method, the cost function includes components that costs the move based on the logic regions' ability to meet timing constraints and on routing resources required by the logic regions. The placement algorithm may also move around components within a logic region. Thus, the cost function may cost the simultaneous movement of logic regions on a target device and components within a logic region. It should be appreciated that the cost function may utilize other parameters to cost the move.

Moves that improve the cost function are always accepted. According to an embodiment of the placement method, some moves that worsen the cost function are also accepted to allow escape from a local minima. The probability that a move that worsen the cost function will be accepted is given by $\exp[-\Delta C/T]$, where C is the cost function and T is an outside parameter. If a number of iterations or moves is sufficiently high, then the probability distribution function of the sampled states will reach equilibrium and converge to $\exp[-\Delta C/T]$. In equilibrium, high values of T imply that almost any state is equally likely to be visited. Similarly, for low values of T, the states visited are likely to be close to the globally minimum value of the cost function. T is initially set to a high value to allow the system to reach equilibrium. Afterwards, T is slowly lowered. According to an embodiment of the present invention, simulated annealing techniques are utilized to implement the placement method. Simulated annealing is a stochastic optimization technique for finding near-optimal solutions in high-dimensional spaces.

Figure 12:
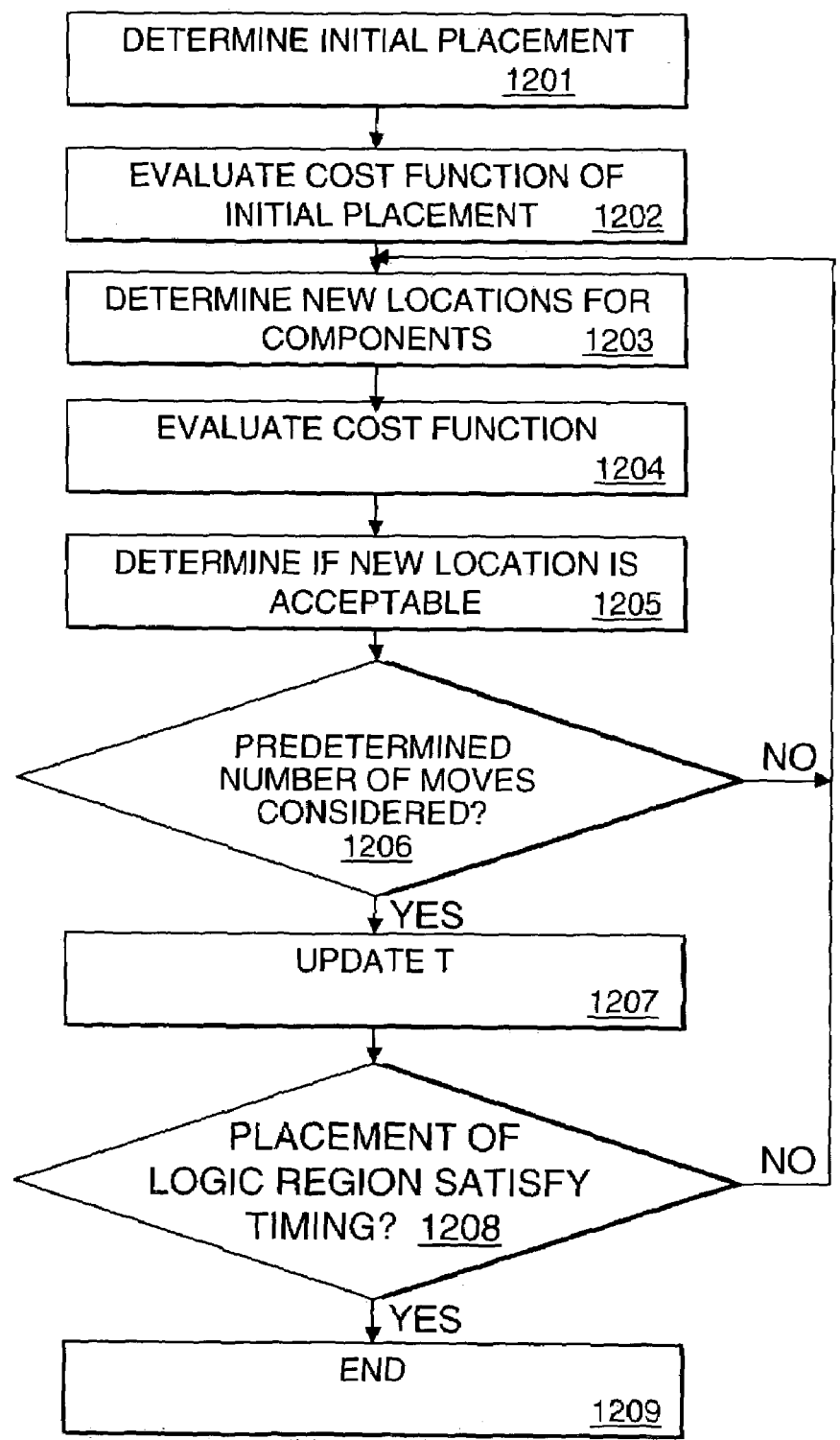
FIG. 12 is a flow chart that illustrates a method for placement of components in a system according to an embodiment of the present invention.

FIG. 12 is a flow chart that illustrates a method for placement of components in a system according to an embodiment of the present invention. At 1201, initial placement of components of the system onto a target device is determined. The placement may involve the placement of components within user defined logic regions and the placement of components not assigned to a logic region.

At 1202, a cost function associated with the initial placement is evaluated.

At 1203, new locations are determined for the components in the system. The new locations are determined with respect to applicable constraints associate with the components. According to an embodiment of the present invention, the new locations for components associated with a logic region are determined using the placement method described.

At 1204, a cost function associated with the components' new locations is evaluated.

At 1205, it is determined whether the new locations are acceptable. According to an embodiment of the present invention, if a random value between 0 and 1 is less than $\exp[-\Delta C/T]$, the move is accepted. In this relationship, $\Delta C$ is the value of the cost function associated with components at the new locations subtracted by the value of the cost function associated with components at the previous locations and T is an outside value. According to an alternate embodiment of the present invention, the new locations are accepted only when they improve the cost function. The components are moved to the new locations if they are acceptable.

At 1206, it is determined whether a predetermined number of iterations or moves have been considered. If the predetermined number of moves have not been considered, control returns to 1203. If the predetermined number of moves have not been considered, control proceeds to 1207.

At 1207, the value T is updated.

At 1208, it is determined whether the current placement of the components satisfies timing constraints. If the current placement of the components does not satisfy timing constraints, control proceeds to step 1203. If the current placement of the components satisfies timing constraints, control proceeds to step 1209.

At 1209, control terminates the process.

According to an embodiment of the present invention, the user may specify that the constraints associated with a defined logic region as soft constraints. By designating a logic region as having a soft constraint or being a "soft logic region", the constraints associated with the logic region will be enforced during the placement procedure until a triggering event. Logic regions not designated as having soft constraints or being soft logic regions are considered to have hard constraints that will always be enforced during the placement procedure. After the occurrence of the triggering event, the soft constraints associated with the logic regions are ignored for the purposes of placement allowing placement to be performed free of the soft constraints. According to an embodiment of the present invention, all components associated with a logic region with soft constraints will be associated with the logic region's first parent logic region with no soft constraints if one exists. If a logic region with soft constraints has no non-soft parent logic region, components associated with the logic region with soft constraints will be free to be placed anywhere on a target device.

According to an embodiment of the present invention, the triggering event may be that of reaching a threshold value. The threshold value may related, for example, to the ratio of the number of acceptable moves generated for logic regions or components in the logic regions (as described in 1205) and the number of proposed moves reaching a threshold value (as described at 1203). Alternatively, the triggering event may be that of the placement of the logic regions failing to satisfy timing requirements. It should be appreciated that other triggering events may be defined.

Figure 13:
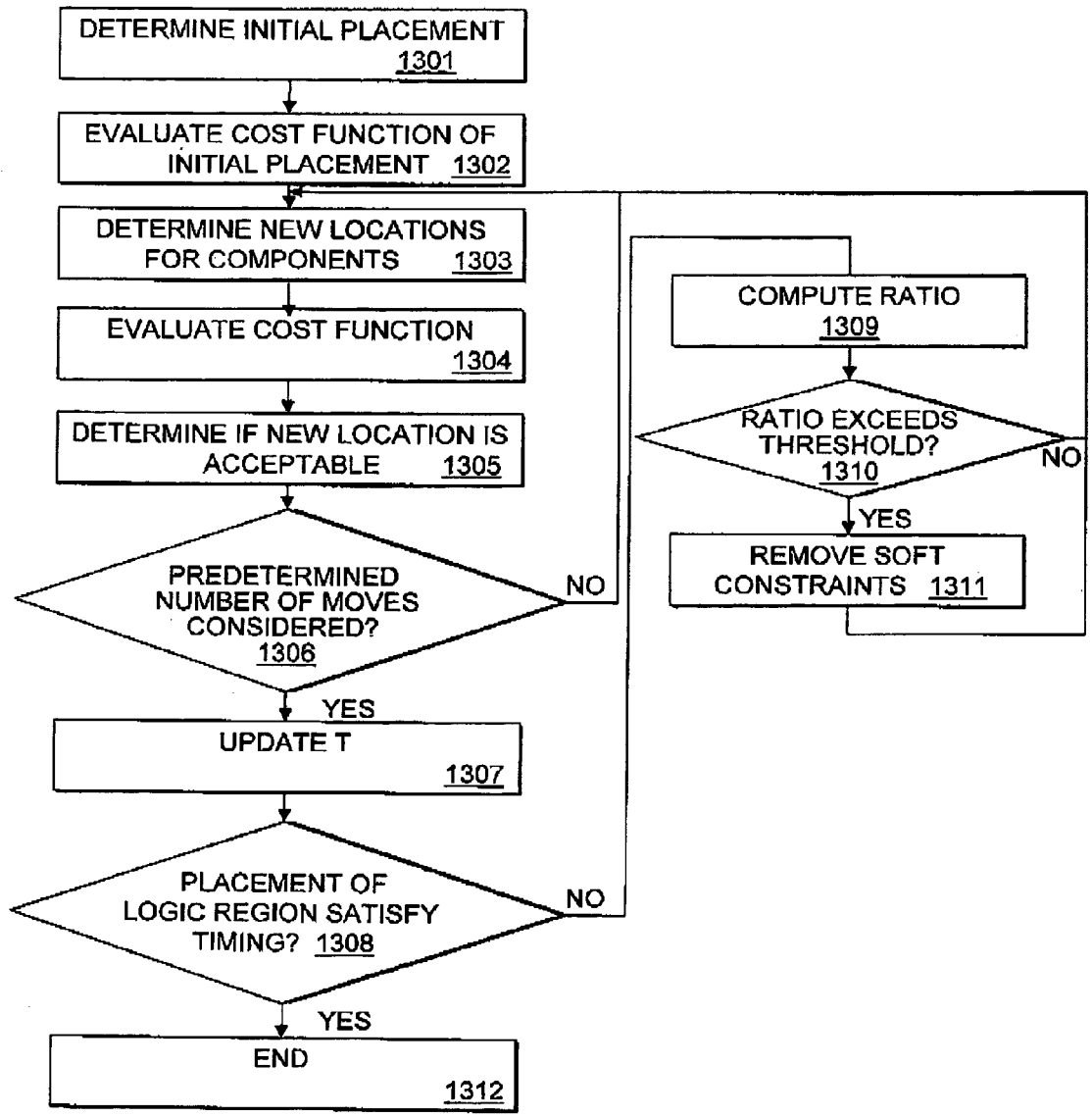
FIG. 13 is a flow chart that illustrates a method for placement of components in a system using soft constraints according to an embodiment of the present invention.

FIG. 13 is a flow chart that illustrates a method for placement of components in a system using soft logic regions according to an embodiment of the present invention. At 1301, initial placement of components of the system onto a target device is determined. The placement may involve the placement of components within user defined logic regions that may be either hard or soft and the placement of components not assigned to a logic region.

At 1302, a cost function associated with the initial placement is evaluated.

At 1303, new locations are determined for the components in the system. The new locations are determined with respect to applicable constraints associate with the components. According to an embodiment of the present invention, the new locations for components associated with a logic region are determined using the placement method described. The placement method determines new locations for the logic regions based upon previous locations.

At 1304, a cost function associated with the components' new locations is evaluated.

At 1305, it is determined whether the new locations are acceptable. According to an embodiment of the present invention, if a random value between 0 and 1 is less than $\exp[-\Delta C/T]$, the move is accepted. In this relationship, $\Delta C$ is the value of the cost function associated with components at the new locations subtracted by the value of the cost function associated with components at the previous locations and T is an outside value. According to an alternate embodiment of the present invention, the new locations are accepted only when they improve the cost function. The components are moved to the new locations if they are acceptable.

At 1306, it is determined whether a predetermined number of iterations or moves have been considered. If the predetermined number of moves have not been considered, control returns to 1303. If the predetermined number of moves have not been considered, control proceeds to 1307.

At 1307, the value T is updated.

At 1308, it is determined whether the current placement of the components satisfies timing constraints. If the current placement of the components does not satisfy timing constraints, control proceeds to step 1309. If the current placement of the components satisfies timing constraints, control proceeds to step 1312.

At 1309, the ratio of the number of new locations determined to be acceptable from 1305 and the number of new locations determined from 1303 is computed.

At 1310, it is determined whether the ratio computed exceeds a threshold value. According to an embodiment of the present invention, the threshold value is 0.44. If the computed ratio exceeds the threshold value, control proceeds to 1311. If the computed ratio does not exceed the threshold value, control proceeds to 1303.

At 1311, the soft constraints associated with logic regions are ignored for the purposes of future determination of new locations for components. Components associated with a logic region with soft constraints are promoted to the first non-soft parent logic region if one exists. Control proceeds to step 1303.

At step 1312, control terminates the process.

Alternatively, it should be appreciated that 1309–1310 may be ignored and 1311 may be performed if it is determined at 1308 that the current placement of components does not satisfy timing.

During the beginning of the placement procedure, constraints associated with logic regions serve to constrain related logic such that they are placed close together. However, later in the placement procedures, constraints associated with logic regions can become too restrictive and prevent the discovery of optimal placement of components. By removing the rectangular region boundary constraint associated with a logic region, the method illustrated in FIG. 13 allows a larger area on a target device to be explored during later stages of placement.

According to an embodiment of the present invention, netlist optimization may be performed after the placement procedure. During netlist optimization, changes may be made to the netlist in order to improve the performance of the system. For example, components may be added to or removed from the system. According to one embodiment, soft constraints associated with logic regions are allowed to be ignored when performing netlist optimization.

Referring back to FIG. 1, at 104, routing of the system is performed. During routing, routing resources on the target device are allocated to provide interconnections between logic gates, logic elements, and other components on the target device. The routing procedure may be performed by a router in an EDA tool (not shown) that utilizes routing algorithms. According to an embodiment of the present invention, user specified routing constraints may be provided to the router to direct the routing of user selected signals (nets), user selected connection corresponding to user selected nets, and user selected segments (route steps) of user selected connections on the target device. The user specified routing constraints may describe routing resources to be used to route the selected connections. For example, the user specified routing constraints may identify specific routing resources that are to be used or generally describe a category or type of routing resource to be used for routing. Thus, the user specified routing constraints may include a general description of routing resources to be utilized or include partial route specifications such that flexibility may be given to a router such as a routing algorithm in a EDA.

The user specified routing constraint may be written into a routing constraint file that includes a list of nets and the constraints for each net. Each constrained net may have constraints for any number of its connections and any number of its segments on a connection. The constraint may be a list of routing resource choices available at a current routing step for routing a segment of the connection. The constraint ends in a block and input port to which the connection is to be routed.

FIG. 14 illustrates an example of a portion of a routing constraint file. In this example, each routing resource choice includes a routing resource type name and a location on the device in use. The user is given flexibility in specifying routing resources by the use of wildcarding. Wildcarding may be used for an entire routing resource choice to allow a router to examine all routing resources at the route step. Wildcarding may also be used for one or more of the location parameters of a routing resource choice to allow the router to examine a subset of the routing resources available at the route step. According to an embodiment of the present invention, a modifier may be utilized to allow a user to specify partial routes in the routing constraint file. The modifier may be used to indicate that a specific routing constraint should be ignored for a specified route step or that a specific routing constraint may be used as many times as required to complete a route.

Figure 15:
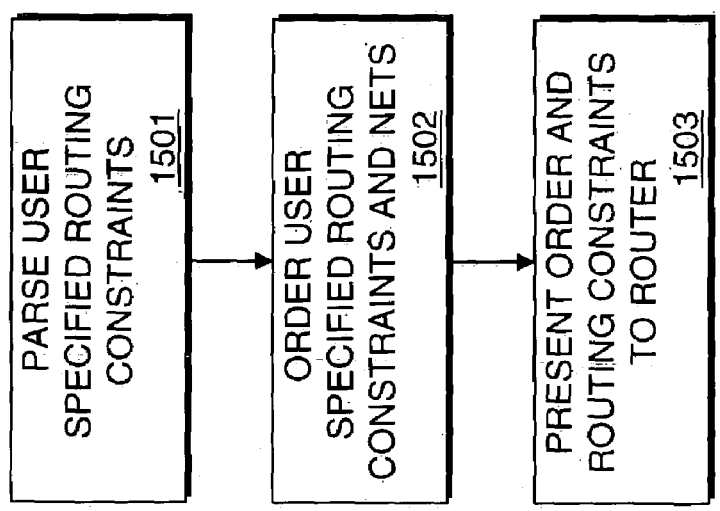
FIG. 15 is a flow chart that illustrates a method for processing user specified routing constraints according to an embodiment of the present invention.

FIG. 15 is a flow chart illustrating how user specified routing constraints are processed according to an embodiment of the present invention. At 1501, the user specified routing constraints are parsed. The names of routing resources, sources, and sinks in the routing constraints in a routing constraint file are compared with that of known routing resources and components on the target device and in the system. Routing constraints that include a reference to a routing resource or component that does not exist and appears to be erroneous are identified and discarded from consideration.

At 1502, the user specified routing constraints are ordered. During the ordering procedure an order is determined in which the nets in the system are to be routed on the target device. The nets are ordered such that the nets having routing constraints are placed earlier in the order so that they are routed before nets not having routing constraints. An order in which connections in a net are to be routed on the target device are also determined. The connections are ordered such that the connections having routing constraints are placed earlier in the order so that they are routed before connections not having routing constraints. It should be appreciated that other considerations may be used to further order the nets and connections to be routed.

At 1503, the order in which the nets and connections associated with the nets are to be routed are presented to the router. The routing constraints associated with each net, connection, and/or segment are also presented to the router such that the router can integrate the constraints with a routing procedure used.

Figure 16:
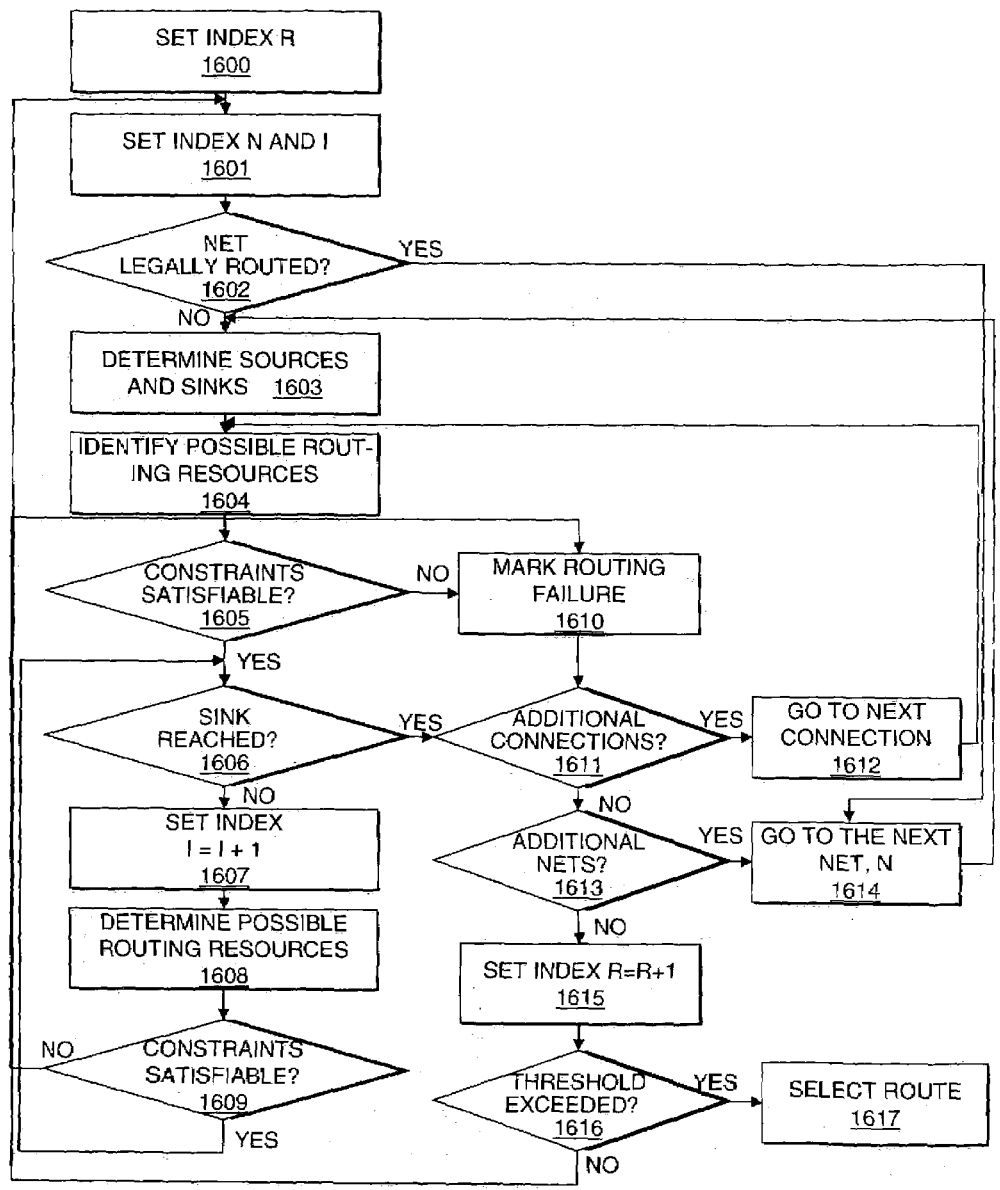
FIG. 16 is a flow chart illustrating a method for performing routing according to an embodiment of the present invention.

FIG. 16 is a flow chart illustrating a method for performing routing according to an embodiment of the present invention. The method described in FIG. 16 may be used to implement block 104 shown in FIG. 1. At 1600, the routing iteration index, r, is set to 1.

At 1601, the net index, n, is set to the first net, 1, and the segment index, i, is set to 1.

At 1602, it is determined whether the current net is legally routed. If the net is not currently routed, control proceeds to 1603. If the current net is legally routed, control proceeds to 1614.

At 1703, the source and sinks are determined for net n. According to an embodiment of the present invention, a source represents a start point for a net or connection on the target device. A sink represents an end or destination point for a net or connection on the device.

At 1604, for the current connection on the current net, all possible routing resources that may be used to route from the source are identified. The identified routing resources may be included in a list referred to as "routing wires for segment i".

At 1605, it is determined whether any of the identified routing resources in the routing wires for segment i list satisfies the applicable routing constraints for the system. If none of the identified routing resources in the routing wires for segment i list satisfies the applicable routing constraints for the system, control proceed to 1610. If at least one of the identified routing resources in the routing wires for segment i list satisfies the applicable routing constraints for the system, control proceeds to 1606. The routing wires for segment i list is updated to include only the routing resources that satisfy the applicable routing constraints. The routing resources in the routing wires for segment i list are potential segments on the connection.

At 1606, it is determined whether a sink for the connection has been reached from each of the identified routing resources in the routing wires for segment i list. If a sink for the connection has been reached, control proceeds to 1611. If a sink for the connection has not been reached, control proceeds to 1607.

At 1607, index i is set to i+1

At 1608, for the current identified routing resource in the connection, all possible routing resources that may be used to route from the identified routing resource are determined. The identified routing resources may be included in a list referred to as "routing wires for segment i".

At 1609, it is determined whether any of the routing resources in the routing wire list satisfies the constrains for the system. If none of the identified routing resources in the routing wire list satisfies the constraints for the system, control proceed to 1610. If at least one of the identified routing resources in the routing wire list satisfies the constraints for the system, control proceeds to 1606. The routing wires list for segment i is updated to include only the routing resources that satisfy the routing constraints. The routing resources in the routing wires list for segment i are potential segments on the connection.

At 1610, the current net is marked to indicate that there is a routing failure and is illegally routed.

At 1611, it is determined whether additional connections are to be routed for the current net. If additional connections are to be routed, control proceeds to 1612. If additional connections are not to be routed, control proceeds to 1613.

At 1612, control prepares to route the next connection. Control proceeds to 1604.

At 1613, it is determined whether additional nets are to be routed. If additional nets are to be routed, control proceeds to 1614. If additional nets are not to be routed, control proceeds to 1615.

At 1614, net index, n, is set to n+1, and segment index, i, is set to 1. Control proceeds to 1603.

At 1615, routing iteration index, r, is set to r+1.

At 1616, it is determined whether the routing iteration index exceeds a routing iteration threshold value. If the routing iteration index exceeds the routing iteration threshold value, control proceeds to 1617. If the routing iteration index does not exceed the routing iteration threshold value, control proceeds to 1601.

At 1617, a route is selected for the connection. According to an embodiment of the present invention, if a plurality of routed paths that connect the source to the sink is available, the path that provides the shortest path, that utilizes routing resources having the smallest cost function value that yields the smallest delay, or that satisfies some other criteria is selected to be the routed path for the connection. If no routed path is available to select from, a routing failure is indicated.

According to an alternate embodiment of the present invention, not all routing resources in the routing wires for segment i list need to be considered as shown. For example, if one routing resource satisfies the constraints for the system and that routing resource is directed towards the sink for the connection, that routing resource will be considered the primary candidate for that segment of the connection. The other routing resources in the routing wires for segment i list (additional potential segments) may be considered in the future if the primary candidate is unable to find a path to the sink that satisfies the constraints of the system.

According to an embodiment of the present invention, a user specified routing constraint may be designated as a soft constraint. By designating a user specified routing constraint as a soft constraint, that user specified routing constraint will be enforced during the routing procedure until a triggering event. User specified routing constraints that are not designated as soft constraints are considered to be hard constraints that will always be enforced during the routing procedure. After the occurrence of the triggering event, the user specified routing constraints that are soft constraints and that are associated with the triggering event will be ignored for the purposes of routing.

According to an embodiment of the present invention, the triggering event may be that of reaching a threshold value. The threshold value may be related, for example, to the number of routing iterations performed. Alternatively, the triggering event may be the failure of satisfying the user specified routing constraint. It should be appreciated that other triggering events may be defined.

The method shown in FIG. 16 may be modified to illustrate the implementation of soft constraints. For example, at 506 a procedure that updates user specified routing constraints that are soft constraints may be called. The soft constraints associated with the routing failure may be removed. After updating the routing constraints, control is allowed to retry the routing.

Figure 17:
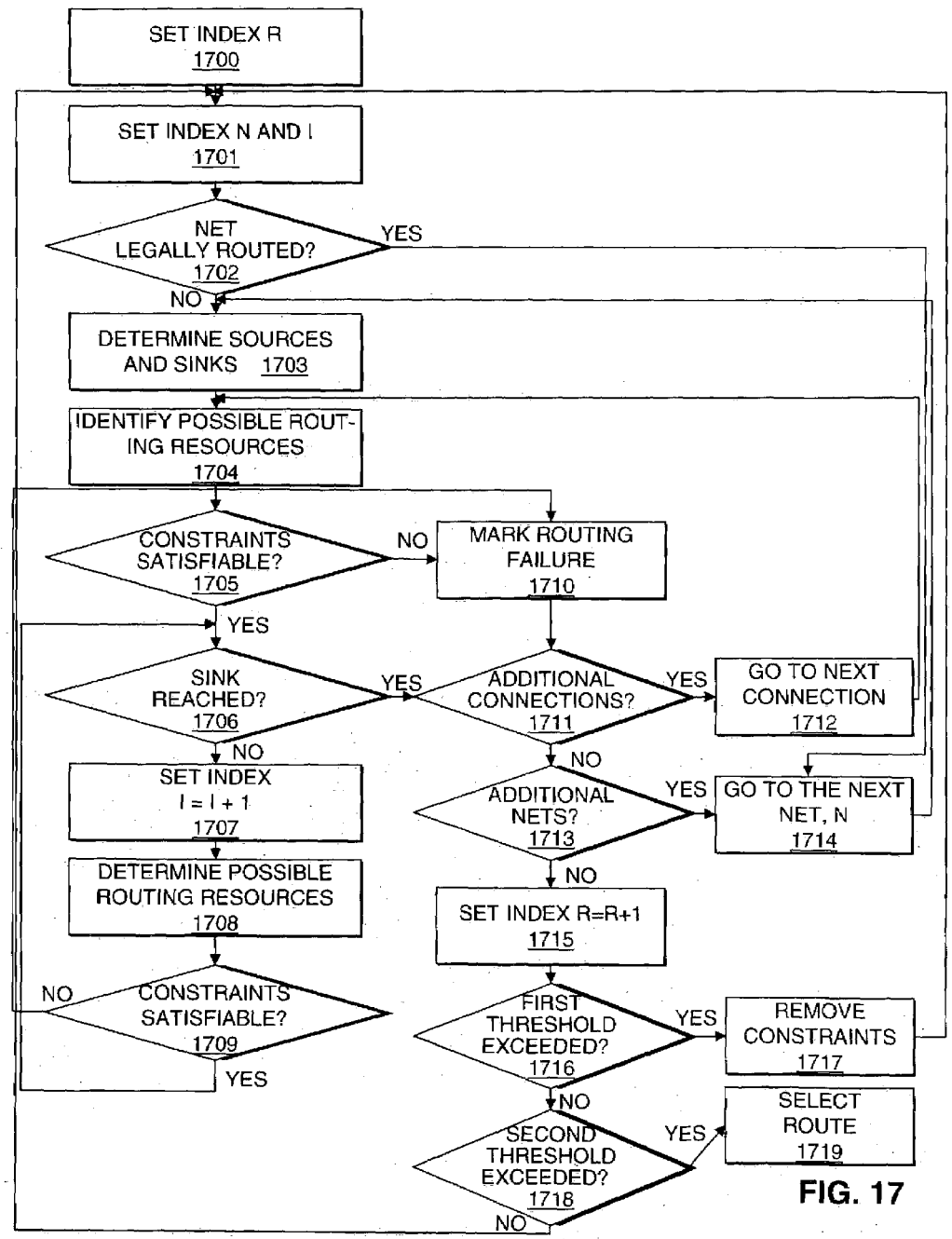
FIG. 17 is a flow chart illustrating a method for performing routing using soft constraints according to an embodiment of the present invention.

FIG. 17 is a flow chart illustrating a method for performing routing with soft constraints according to an embodiment of the present invention. At 1700, the routing iteration index, r, is set to 1.

At 1701, the net index, n, is set to the first net, 1, and the segment index, i, is set to 1.

At 1702, it is determined whether the current net is legally routed. If the net is not currently routed, control proceeds to 1703. If the current net is legally routed, control proceeds to 1714.

At 1603, the source and sinks are determined for net n. According to an embodiment of the present invention, a source represents a start point for a net or connection on the target device. A sink represents an end or destination point for a net or connection on the device.

At 1704, for the current connection on the current net, all possible routing resources that may be used to route from the source are identified. The identified routing resources may be included in a list referred to as "routing wires for segment i".

At 1705, it is determined whether any of the identified routing resources in the routing wires for segment i list satisfies the applicable routing constraints for the system. If none of the identified routing resources in the routing wires for segment i list satisfies the applicable routing constraints for the system, control proceed to 1710. If at least one of the identified routing resources in the routing wires for segment i list satisfies the applicable routing constraints for the system, control proceeds to 1706. The routing wires for segment i list is updated to include only the routing resources that satisfy the applicable routing constraints. The routing resources in the routing wires for segment i list are potential segments on the connection.

At 1706, it is determined whether a sink for the connection has been reached from each of the identified routing resources in the routing wires for segment i list. If a sink for the connection has been reached, control proceeds to 1711. If a sink for the connection has not been reached, control proceeds to 1707.

At 1707, index i is set to i+1

At 1708, for the current identified routing resource in the connection, all possible routing resources that may be used to route from the identified routing resource are determined. The identified routing resources may be included in a list referred to as "routing wires for segment i".

At 1709, it is determined whether any of the routing resources in the routing wire list satisfies the constrains for the system. If none of the identified routing resources in the routing wire list satisfies the constraints for the system, control proceed to 1710. If at least one of the identified routing resources in the routing wire list satisfies the constraints for the system, control proceeds to 1706. The routing wires list for segment i is updated to include only the routing resources that satisfy the routing constraints. The routing resources in the routing wires list for segment i are potential segments on the connection.

At 1710, the current net is marked to indicate that there is a routing failure and is illegally routed.

At 1711, it is determined whether additional connections are to be routed for the current net. If additional connections are to be routed, control proceeds to 1712. If additional connections are not to be routed, control proceeds to 1713.

At 1712, control prepares to route the next connection. Control proceeds to 1704.

At 1713, it is determined whether additional nets are to be routed. If additional nets are to be routed, control proceeds to 1714. If additional nets are not to be routed, control proceeds to 1715.

At 1714, net index, n, is set to n+1, and segment index, i, is set to 1. Control proceeds to 1703.

At 1715, routing iteration index, r, is set to r+1.

At 1716, it is determined whether the routing iteration index exceeds a first routing iteration threshold value. If the routing iteration index exceeds the first routing iteration threshold value, control proceeds to 1717. If the routing iteration index does not exceed the first routing iteration threshold value, control proceeds to 1718.

At 1717, the user specified routing constraints that are soft constraints are removed to allow routing to be performed without taking the soft constraints into consideration. Control proceeds to 1701.

At 1718, it is determined whether the routing iteration index exceeds a second routing iteration threshold value. If the routing iteration index exceeds the second routing iteration threshold value, control proceeds to 1719. If the routing iteration index does not exceed the second routing iteration index, control proceeds to 1701.

At 1719, a route is selected for the connection. According to an embodiment of the present invention, if a plurality of routed paths that connect the source to the sink is available, the path that provides the shortest path, that utilizes routing resources having the smallest cost function value that yields the smallest delay, or that satisfies some other criteria is selected to be the routed path for the connection. If no routed path is available to select from, a routing failure is indicated.

FIGS. 1, 7, 12, 13, and 15–17 are flow charts illustrating various methods according to embodiments of the present invention. Some of the techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

According to an embodiment of the present invention, a method for designing a system on a target device utilizing PLDs is disclosed. The method includes generating options for utilizing resources on the PLDs in response to user specified constraints. The options for utilizing resources may include, for example, possible locations to place components within user-defined logic regions on the target device. The options for utilizing resources may also include routing strategies for routing signals on the PLDs in response to user specified routing constraints.

The method also includes subsequently refining the options for utilizing the resources independent of the user specified constraints. According to one embodiment, refining the options for utilizing the resources on the target device independent of the user specified constraints includes determining locations to place the components on the target device by removing constraints associated with the user-defined logic regions. According to a second embodiment, refining the options for utilizing the resources independent of the user specified constraints includes determining routing resources to allocate to the user specified signals on the PLD by removing the user specified routing constraints.

Refining the options for utilizing the resources may be performed in response to the options not satisfying design parameters such as system timing constraints and system architecture constraints or not satisfying user specified constraints such as those associated with logic regions and user specified routing constraints. Refining the options for utilizing the resources may also be performed in response to having a threshold number of options generated or in response to other triggering events.

Although examples of utilizing soft constraints have been given with respect to placement and routing on a PLD, it should be appreciated that soft constraints may also be utilized in structured ASICs. According to an embodiment of the present invention where layers of a chip may be fabricated according to the specification of a designer, placement and routing of components on the layers may be determined by an EDA tool utilizing soft constraints as described.

Embodiments of the present invention (e.g. exemplary process described with respect to FIGS. 1, 7, 12, 13, and 15–17) may be provided as a computer program product, or software, that may include a machine-readable medium having stored thereon instructions. The machine-readable medium may be used to program a computer system or other electronic device. The machine-readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for designing a system on a target device utilizing a programmable logic device (PLD) with an electronic automation design tool (EDA), comprising:
    having the EDA tool determine a first location on the PLD to place a user defined logic region in response to user specified constraints for placement of the user defined logic region;
    having the EDA tool determine a second location to place the user defined logic region, wherein the second location is determined independent of the user specified constraints for placement; and
    determining routing resources to allocate to user specified signals on the target device in response to user specified routing constraints.

2. The method of claim 1, wherein having the EDA tool determine the second location is performed in response to the first location not satisfying design parameters.

3. The method of claim 1, wherein having the EDA tool determine the second location is performed in response to the first location not satisfying the user specified constraints.

4. The method of claim 1, wherein having the EDA tool determine the second location is performed in response to a triggering event.

5. The method of claim 1, further comprising determining positions to place components within user defined logic regions on the target device.

6. The method of claim 5, wherein determining positions to place the components is an iterative procedure that includes:
    selecting positions;
    evaluating the positions with a cost function; and
    accepting the positions if the cost function yields a desired value.

7. The method of claim 5, wherein determining the positions comprises removing constraints associated with the user defined logic regions.

8. The method of claim 1, wherein determining routing resources is an iterative procedure that includes:
selecting routing resources;
determining whether routing resource selections satisfy the user specified routing constraints; and
re-selecting routing resources if the routing resource selections do not satisfy the user specified routing constraints.

9. The method of claim 1, wherein re-selecting the routing resources comprises determining routing resources to allocate to the user specified signals on the PLD by removing the user specified routing constraints.

10. A method for designing a system on a target device utilizing a programmable logic device (PLD), comprising:
determining a first location on the PLD to place a user defined logic region in response to user specified constraints for placement of the user defined logic region; and
determining a second location to place the user defined logic region, wherein the second location is determined independent of the user specified constraints for placement in response to having a threshold number of first locations generated.

11. A method for positioning components of a system onto a target device utilizing a programmable logic device (PLD) using an electronic design automation tool, comprising:
having the EDA tool determine a first location on the PLD to place a user defined logic region in response to user specified constraints for placement of the user defined logic region;
determining whether the user specified constraint is a soft constraint in response to the system not satisfying timing; and
having the EDA tool determine a second location to place the user defined logic region, wherein the second location is determined independent of the user specified constraints for placement if the user specified constraint is a soft constraint, and in response to having a threshold number of first locations determined.

12. The method of claim 11, wherein determining the first location to place the user defined logic region comprises:
assigning an initial location for the user defined logic region;
moving the user defined logic region to a new location; and
evaluating a cost function associated with the user defined logic region in the new location.

13. The method of claim 12, wherein evaluating the cost function comprises:
determining a timing of the system associated with the user defined logic region in the new location; and
determining routing resources requirements associated with the user defined logic region in the new location.

14. The method of claim 11, further comprising determining possible locations to place a component in the user defined logic region that includes:
assigning an initial location for the component in the user defined logic region; and
evaluating a cost function as the user defined logic region and the component are moved.

15. The method of claim 14, further comprising determining possible locations to move the component from the possible locations to place the component independent of the constraints associated with the user defined logic region.

16. The method of claim 15, wherein determining possible locations to move the component is performed in response to the possible locations not satisfying user specified constraints.

17. A method for designing a system on a programmable logic device (PLD) using an electronic design automation (EDA) tool, comprising:
having the EDA tool determine routing strategies for routing signals on the PLD in response to user specified routing constraints that pertain to categories of routing resources to use by selecting routing resources for a user specified signal on the PLDs in response to the user specified routing constraints, and selecting routing resources for a non-user specified signal on the PLDs without utilizing the user specified routing constraints; and
having the EDA tool determine additional routing strategies for routing the signals on the PLD where the additional routing strategies are independent of the user specified routing constraints.

18. The method of claim 17, wherein determining additional routing strategies for routing the signals comprises selecting routing resources for the user specified signal on the PLDs independent of the user specified routing constraints.

19. The method of claim 17, wherein determining additional routing strategies for routing the signals is performed in response to the routing strategies not satisfying user specified routing constraints.

20. The method of claim 17, wherein determining additional routing strategies for routing the signals is performed in response to the routing strategies not satisfying design parameters.

21. A method for designing a system on a programmable logic device (PLD) using an electronic design automation (EDA) tool, comprising:
having the EDA tool determine routing strategies for routing signals on the PLD in response to user specified routing constraints that pertain to categories of routing resources to use; and
having the EDA tool determine additional routing strategies for routing the signals on the PLD where the additional routing strategies are independent of the user specified routing constraints in response to a threshold number of routing strategies being determined.

22. A machine-readable medium having stored thereon sequences of instructions, the sequences of instructions including instructions which, when executed by a processor, causes the processor to perform:
determining a first location on a programmable logic device (PLD) to place a user defined logic region in response to user specified constraints for placement of the user defined logic region; and
determining a second location to place the user defined logic region wherein the second location is determined independent of the user specified constraints for placement in response to having a threshold number of first locations determined.

23. The machine-readable medium of claim 22, further comprising determining locations to place components within user defined logic regions on the target device.

24. The machine-readable medium of claim 23, further comprising determining locations to place the components on the target device by removing constraints associated with the user defined logic regions.

25. A machine-readable medium having stored thereon sequences of instructions, the sequences of instructions including instructions which, when executed by a processor, causes the processor to perform:

determining a first location on a programmable logic device (PLD) to place a user defined logic region in response to user specified constraints for placement of the user defined logic region; and determining a second location to place the user defined logic region wherein the second location is determined independent of the user specified constraints for placement; and determining routing resources to allocate to user specified signals on the target device in response to user specified routing constraints.

26. The machine-readable medium of claim 25, further comprising ignoring the user specified routing constraints.

* * * * *